United States Patent
Egitto et al.

(10) Patent No.: US 6,613,184 B1
(45) Date of Patent: *Sep. 2, 2003

(54) STABLE INTERFACES BETWEEN ELECTRICALLY CONDUCTIVE ADHESIVES AND METALS

(75) Inventors: Frank Daniel Egitto, Binghamton, NY (US); Paul Eugene Logan, Endicott, NY (US); Luis Jesus Matienzo, Endicott, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/855,811

(22) Filed: May 12, 1997

(51) Int. Cl.[7] .................................................. C09J 5/04
(52) U.S. Cl. ....................... 156/314; 156/326; 428/420
(58) Field of Search ................................ 156/314, 326; 428/420; 427/207.1, 400

(56) References Cited

U.S. PATENT DOCUMENTS

| | | | |
|---|---|---|---|
| 3,715,371 A | * | 2/1973 | Thomson .................... 156/326 |
| 3,788,895 A | * | 1/1974 | Schimmer et al. .......... 428/420 |
| 3,911,169 A | | 10/1975 | Lesaicherre, et al. |
| 3,956,353 A | * | 5/1976 | Plueddemann .............. 428/420 |
| 4,502,903 A | * | 3/1985 | Bruder ........................ 156/324 |
| 4,616,413 A | * | 10/1986 | Iliou et al. .................. 156/307.3 |
| 4,727,168 A | | 2/1988 | Yoshino et al. |
| 4,963,425 A | | 10/1990 | Buchanan et al. |
| 4,976,990 A | | 12/1990 | Bach et al. |
| 5,002,808 A | * | 3/1991 | Hahn et al. ................. 428/420 |
| 5,112,395 A | | 5/1992 | Ngo |
| 5,172,301 A | | 12/1992 | Schneider |
| 5,180,625 A | | 1/1993 | Wang et al. |
| 5,210,941 A | | 5/1993 | Turek et al. |
| 5,221,399 A | | 6/1993 | Sanborn et al. |
| 5,355,280 A | | 10/1994 | Rothlingshofer et al. |
| 5,362,421 A | | 11/1994 | Kropp et al. |
| 5,366,027 A | | 11/1994 | Turek et al. |
| 5,393,362 A | * | 2/1995 | Culler ......................... 156/314 |
| 5,432,303 A | | 7/1995 | Turek et al. |
| 5,437,937 A | * | 8/1995 | Cayless ...................... 427/207.1 |
| 5,448,020 A | | 9/1995 | Pendse |
| 5,455,738 A | | 10/1995 | Montesano et al. |
| 5,490,895 A | | 2/1996 | Wang et al. |
| 5,538,789 A | | 7/1996 | Capote et al. |
| 5,565,267 A | | 10/1996 | Capote et al. |
| 5,731,369 A | * | 3/1998 | Mahoney .................... 503/458 |
| 5,958,578 A | * | 9/1999 | Blohowiak et al. ......... 428/336 |

FOREIGN PATENT DOCUMENTS

JP    54081353    6/1979

OTHER PUBLICATIONS

Methods to Electrically Connect A1 Heat Sinks To Semiconductor Chip Packages—IBM Technical Disclosure Bulletin vol. 35 No. 1A Jun. 1992.

"Process and Performance Advancements in Conductive Bonding of Circuit Cards to Aluminum Thick Metal Backers." Donald Farquhar, Michael Klodowski, Andy Seman and David Light.

Process for Improved Photoresist to Polyimide Adhesion-Reproduced from Research Disclosure, Dec. 1989, No. 308—Kenneth Mason Publications, Ltd. England.

Process for Enhanced Polyimide Adhesion—Reproduced from Research Disclosure, Feb. 1986, No. 262—Kenneth Mason Publications Ltd. England.

* cited by examiner

Primary Examiner—Michael W. Ball
Assistant Examiner—John T. Haran
(74) Attorney, Agent, or Firm—Bernard Tiegerman; William N. Hogg; Arthur J. Samodovitz

(57) ABSTRACT

The electrical properties of the bond formed between a metal substrate and an electrically conductive adhesive is improved, especially in high humidity conditions, by applying to the metal substrate an organic coupling agent prior to application of the electrically-conductive adhesive thereto.

14 Claims, 4 Drawing Sheets

STABLE INTERFACES BETWEEN ELECTRICALLY CONDUCTIVE ADHESIVES AND METALS

BACKGROUND OF THE INVENTION

The present invention relates to a technique for improving the electrical properties of the adhesive bond formed between a metal surface and an electrically conductive adhesive.

In modern electronic devices, there are many applications in which electrically conductive elements are bonded to one another by means of electrically-conductive adhesives. For example, wireless cards are often bonded to thick metal backers, especially those formed from aluminum and its alloys, using electrically-conductive adhesives.

The formation of metal oxide, hydroxide, and other corrosion products at the interface between a conductive adhesive and the metal bonding surface (adherend) can compromise both the electrical and mechanical stability of such adhesive bonds, and thus the performance and reliability of the packaging structure. This problem is particularly troublesome in humid environments, especially in the case of adhesively-bonded aluminum.

Aluminum surfaces are protected by a naturally formed thin layer of aluminum oxide that provides passivation of the metal at room temperature and moderate relative humidity. Although the native oxide of aluminum is a poor conductor, it is thin enough to allow a reasonably low contact resistance for conductive interconnections and resists further degradation of the electrical interconnection. Exposure to higher temperatures and humidity induces a transformation of the aluminum oxide to aluminum oxyhydroxide (AlOOH) and finally, if the transformation is complete, aluminum hydroxide ($Al(OH)_3$). These changes in surface composition are accompanied by a transformation of the original morphology of the thin oxide layer to a "corn flake" type structure and finally to platelets. These changes are associated with layers that are mechanically weaker, and non-passivating (i.e., offer no protection of the underlying aluminum/aluminum oxide surface from corrosion). Because it is possible to change the thickness of the oxide layer by these transformations, the mechanical integrity of an adhesive/aluminum oxide interface becomes weaker. Such transformations can also lead to substantial increases in interfacial electrical resistance through the bond and ultimately to mechanical separation of the bonded surfaces (adhesive to aluminum).

Roughening of surfaces, for example by sand blasting, chemical etching, or anodization has been commonly practiced to enhance adhesion of aluminum/polymer adhesive systems and to provide structural durability in humid or corrosive environments. However, when the bond must be electrically conductive, treatments that improve adhesion by producing a thick oxide layer, such as phosphoric acid or chromic acid anodization, are not suitable because of the poor electrical properties of the thick oxide layers.

The Forest Products Laboratory (FPL) process, developed in 1950, has been found to be effective in enhancing the structural stability of non-conductive adhesive bonds to aluminum in humid environments, especially when used in conjunction with organic corrosion inhibitors. See J. S. Ahearn, G. D. Davis, T. S. Sun and J. D. Venables, "Adhesion Aspects of Polymer Coatings," edited by K. L. Mittal, Plenum Publishing Corp., 1982 p.281. However, treatments for promoting electrical stability of electrically conductive bonds to aluminum using electrically conductive adhesives are not known.

Accordingly, there is a need for new technology for forming bonds between metal substrates, especially aluminum substrates, and electrically-conductive adhesives which promote and maintain good ohmic contact between the adhesive and the metal to which is bonded, even when the bond is subjected to humid environments over extended periods of time.

SUMMARY OF THE INVENTION

In accordance with the present invention, it has been found that the increase in electrical resistance of a metal/adhesive bond when subjected to humid conditions for extended periods of time can be reduced or even eliminated by treating the surface to be bonded with a specific organic chemical preferably organic coupling agents such as organosilanes, organotitanates and organozirconates, prior to application of the electrically-conductive adhesive.

Thus, the present invention provides a new technique for enhancing the electrical properties of the bond between an electrically-conductive adhesive and a metal substrate attached thereto. The technique comprises treating the metal surface to be bonded with an organic material that chemically bonds to the metal surface and subsequently is capable of reacting with the polymer in the adhesive. In addition, the present invention also provides new electrical components containing metal elements bonded to electrically-conductive adhesives, the components containing a layer of an adhesion promoter between the substrate and the adhesive, the adhesion promoter comprising a material capable of bonding to the metal of the substrate and also of capable of reacting with the adhesive.

DETAILED DESCRIPTION

Figure 1:
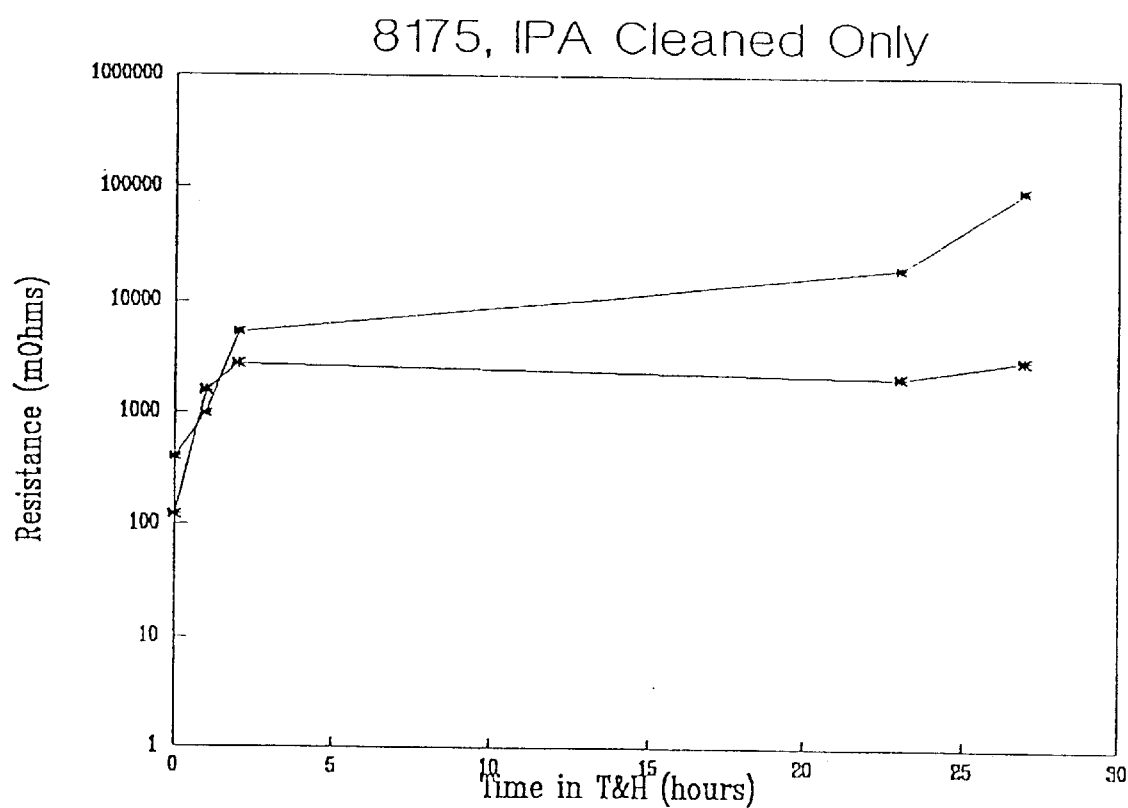
FIGS. 1 to 4 are graphical representations of the result obtained in Examples 1 to 4 discussed later in this specification.

Electrically-conductive adhesives are commonly used for ahesively and electrically bonding together a wide variety of different electrically-conductive components. For example, circuit boards or cards can be directly bonded, adhesively and electrically, to metal substrates such as metal heatsinks by means of electrically-conductive adhesives. In some applications, a continuous electrically-conductive surface of the component can be bonded to the metal backing by a continuous layer of an electrically-conductive adhesive. In other applications, selective areas of the component, for example electrical contacts on a card or circuit board surface, can be bonded to the metal backer by means of individual, discrete, normally co-planar layers of electrically-conductive adhesive, each discrete layer being associated with one electrical contact on the board.

Electrically conductive adhesives can also be used to replace traditional solder as, for example, in the case of bonding a wire to the electrical contact of an electronic device.

The present invention is broadly applicable to all these applications of electrically-conductive adhesives, as well as any other use for these materials.

In accordance with the present invention, the surface of the metal article or substrate to be bonded, both electrically and adhesively, to the electrically-conductive adhesive is treated with an organic material that chemically bonds to the metal surface and subsequently is capable of reacting with the polymer in the adhesive. Such materials are well known and exemplified, for example, by coupling agents containing organic groups, hereinafter "organic coupling agents".

Organic coupling agents take the form of compounds having at least one functional group capable of bonding to a metal substrate and another functional group capable of bonding to different types of polymers. Organosilanes, organotitanates and organozirconates are good examples of these types of compounds. Typically, these compounds contain an organomoiety having a terminal group capable of reacting with one or more different types of organic polymers, such terminal groups being exemplified by amino, epoxy, carboxyl, halo, mercapto, acrylate, etc. In addition, these compounds also typically include one or more groups capable of bonding to the metal substrate, such groups usually comprising alkoxy, aryloxy, or halide groups.

In this context, it is well known that most metals, when exposed to the atmosphere, form oxides on their surfaces. In addition, it is also known that hydroxyl groups become associated with such oxides when the surface is exposed to water, typically in the atmosphere, either by chemical reaction or by adsorption through hydrogen bonding, van derWaals forces and the like. When an organosilane coupling agent is contacted with such a surface, a hydrolysis reaction occurs in which the alkoxy group on the silicon atom is driven off as an alcohol via reaction with surface hydroxyl groups of the metal substrate. This reaction "anchors" the organic moeity to the metal substrate and allows the "other end" of the organosilane to bond with a subsequently applied polymer adhesive or other material. Analogous reactions occur when the coupling agent is an organotitanate or organozirconate.

In accordance with the present invention, any compound which will bond to the metal substrate and also react with a subsequently applied polymer adhesive can be employed in the present invention. Specific examples are illustrated in G. Tesoro and Y. Wu "Silicon Coupling Agents: The role of the Functional Group," J. Adhesion Sci. Technol., 5, 771 (1991). Other useful materials are described, for example, in U.S. Pat. No. 3,911,169, U.S. Pat. No. 4,976,990, U.S. Pat. No. 4,727,168, U.S. Pat. No. 5,112,395 and Japanese Patent 77149538 (771213), the disclosures of which are incorporated herein by reference.

Preferred adhesion promoters are organosilanes, titanates and zirconates containing alkoxy or halide groups. Particularly preferred adhesion promoters are organosilanes containing alkoxy (e.g. methoxy, ethoxy or propoxy) groups or halides attached directly to the silicon atom plus an additional functional group such as amino or glycido remote from the silicon atom. Examples of such adhesion promoters are trimethoxy-3-glycidoxy silane sold under the designation Z-6040 from Dow Corning, gamma-aminopropyltriethoxysilane sold under the designation A-1100 by Union Carbide and also under the designation Aø75ø by Petrarch of Bristol, Pa. and N-(2-amino)-3-aminopropyltrimethoxysilane sold under the designation Z-6020 by Dow Corning.

The adhesion promoter can be applied to the metal substrate by any conventional technique. Most conveniently, the adhesion promoter is applied by spraying the adhesion promoter in liquid form on the surface to be treated or dipping the surface to be treated in a container containing the adhesion promoter. In this connection, the adhesion promoter can be used as is, i.e. undiluted, or it can be diluted with a suitable solvent such as an alcohol or water. Isopropyl alcohol or a mixture of isopropyl alcohol and water are preferred. The concentration of the adhesion promoter in the solvent is not critical and can easily be determined by routine experimentations for optimal performance. Concentrations on the order of 0.5 to 10 wt. %, more preferably 1 to 5 wt. %, have been found to be suitable, although any concentration can be used.

The amount of adhesion promoter to be applied to the metal substrate is not critical and can vary widely. Theoretically, only a single atomic layer of the adhesion promoter need be applied. In practice, the amount applied should be such that the adhesion promoter is present in a layer of 100 Angstroms or less in thickness, preferably 50 Angstroms or less. Thicker layers can be used, although this may adversely affect the electrical properties of the bond.

After the metal substrate is treated with the adhesion promoter, as discussed above, it can be allowed to dry as is. Alternately, it can be rinsed so as to remove excess adhesion promoter. This can be done by spraying the treated surface with, or dipping the treated surface in, a suitable solvent such as water, alcohol or a mixture of alcohol and water. A mixture of water and isopropyl alcohol is preferred.

Once the liquid adhesion promoter is applied as discussed above, the so-treated surface can simply be dried, if desired. For example, the treated metal substrate can be subjected to blow drying in atmospheric air. Preferably, however, the treated substrate is heated slightly as, for example, by heating in air at one hour at 78° C. This not only insures complete drying but also accelerates the hydrolysis reaction which occurs when the adhesion promoter bonds to the metal substrate.

The pretreating procedure of the present invention as discussed above can be applied to metal surfaces of the component to be bonded directly without any surface preparation. Alternatively, the metal surface to be bonded can be cleaned so as to remove any dirt, oxides, machining oils and so forth form its surfaces prior to application of the adhesion promoter. Surface cleaning can be accomplished by any technique known in the art. For example, surface cleaning can be accomplished by sandblasting or chemical etching or simple cleaning with a solvent such as isopropyl alcohol or the like.

Once the metal surface to be bonded is pretreated with an adhesion promoter in accordance with the present invention, it is contacted with a suitable electrically-conductive adhesive. Electrically-conductive adhesives are well known in the art, and any electrically-conductive adhesive can be used in accordance with the present invention. Conventionally, electrically-conductive adhesives are composed of a polymer adhesive which contains an electrically-conductive material dispersed therein. Epoxy adhesives containing particulate silver, or particulate ceramics such as mica coated with silver, are a common, well-known type of electrically-conductive adhesive. Electrically-conductive adhesives can also be filled with other electrically-conductive particulate materials such as gold, nickel, palladium and the like. Also, the adhesive portion of the electrically-conductive adhesive can be formed from other adhesive resins such as silicones, silicone/epoxies, polyamides and the like. Any such electrically-conductive adhesive can be used in accordance with the present invention of course, the adhesive to be used should be one which reacts with the reactive moiety in the adhesion promoter used in accordance with the present invention to pretreat the metal surface for adhesion promotion.

Once the electrically-conductive adhesive is applied to the metal substrate, the electrically-conductive article to be bonded thereto, the adherend, is contacted therewith to complete the physical and electrical connection of two electrically-conductive articles. If desired, the adherend can also be treated with an adhesion promoter in accordance with the present invention so that the electrical properties of its adhesive/metal bond are improved as well.

In order to more thoroughly illustrate the present invention, the following examples were conducted. In these examples, two flat-headed rivets made from 6061 aluminum alloy were joined together at their heads by means of an electrically-conductive adhesive composed of epoxy filled with 80% weight percent silver particles. In each example, the surface of the rivet heads to be bonded were first ultrasonically cleaned in isopropyl alcohol. Thereafter, the metal surfaces so cleaned were subjected to additional processing steps. Once the processing was completed, the two rivets were joined together by means of a layer of the above electrically-conductive adhesive and the joined rivets were then maintained at a temperature of 150° C. under a pressure of 1 psi to effect cure of the adhesive under the conditions recommended by the manufacturer.

The electrical properties of the adhesive bonds so formed as a function of time were then tested by measuring the resistance across the joined rivets, i.e. from the tail of one rivet through the adhesive bond to the tail of the other rivet. This was done by placing the joined rivets in a chamber maintained at 85° C. and 85% relative humidity and connecting the leads of an ohmmeter to the tails of the two rivets. Resistance was measured for periods of up to 150 hours to determine the effect on the electrical properties on the bond of high humidity conditions. Also the experiment in each example was repeated a number of times to insure reliability.

EXAMPLE 1

In this example, the two rivets were joined immediately after ultrasonic cleaning with isopropyl alcohol, no other treatment being conducted. The electrical properties of the metal/adhesive/metal bond produced, under the test conditions described above, are illustrated in FIG. 1.

As shown in this figure, the initial resistance of approximately 100 and 600 milliohms, respectively, increased within a few hours by a power of 10. Thereafter, the resistance remained constant for approximately 25 hours after which it began to increase again. The test was terminated after about 28 hours since resistance levels on the order of 5 to 10 thousand milliohms were deemed unacceptable.

EXAMPLE 2

Example 1 was repeated except that, after cleaning with isopropyl alcohol, the two metal surfaces to be bonded were further cleaned by a vapor blast technique. In this technique, a slurry of a sand abrasive in water was sprayed at high pressure at the surfaces to be bonded so as to further clean and roughen the surfaces. After this further cleaning procedure, the rivets were joined together in the manner described above to produce the test product of Example 2.

Figure 2:
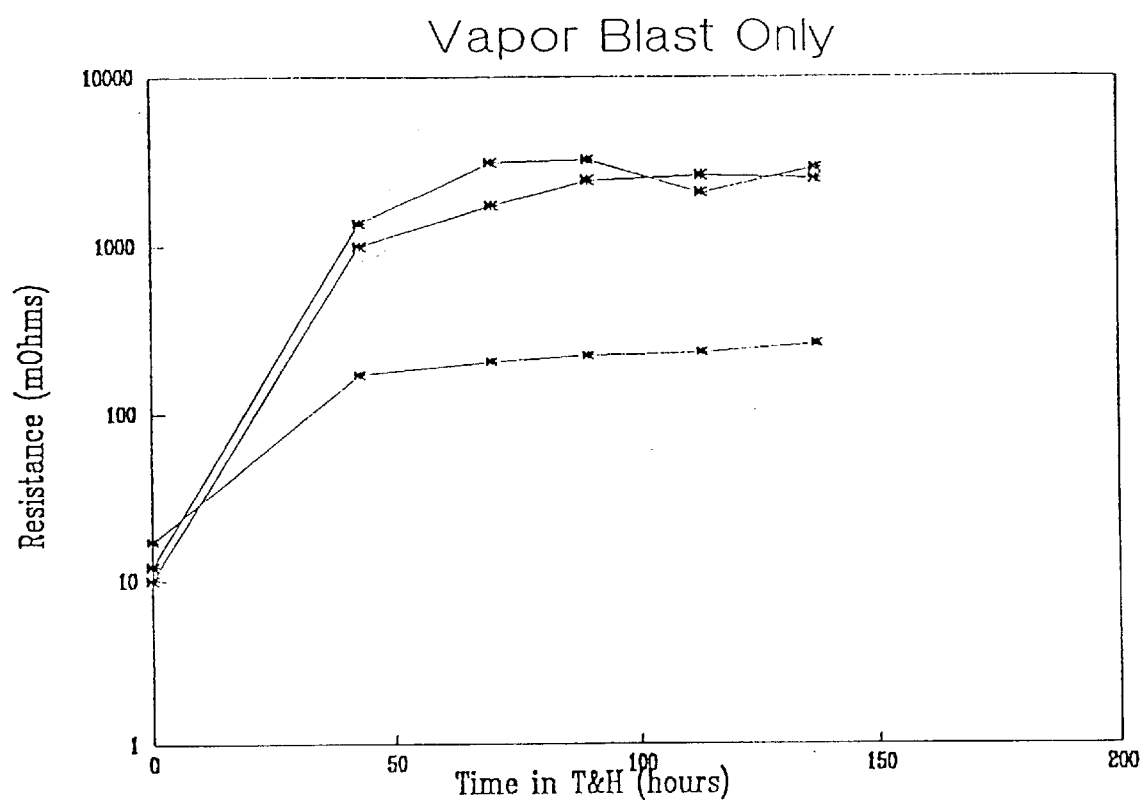

The joined rivets of this example were then subjected to the same test procedure described above. The results obtained are illustrated in FIG. 2.

As shown in this figure, the resistance of the bond so formed was far better than that of Example 1 in terms of initial resistance, the "plateau resistance" (i.e. the essentially constant resistance reached after the initial resistance increase), and the overall time period over which the resistance remained essentially constant. Also, the results obtained in one of the three experiments conducted in this example were particularly good, although these results were not reproducible in the other experiments.

This shows that the additional cleaning and surface roughening provided by vapor blasting significantly enhanced the electrical properties of the adhesive/metal bond produced.

EXAMPLE 3

Figure 3:
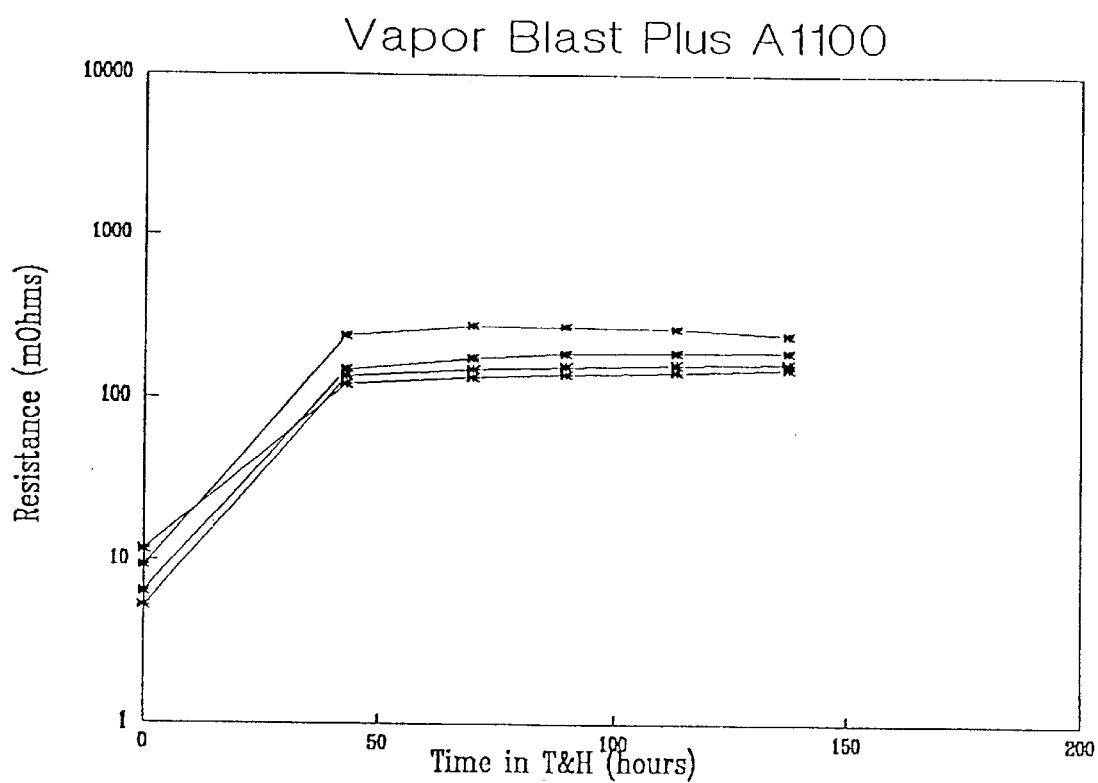

Example 2 was repeated except that after the vapor blasting procedure and prior to application of the electrically-conductive adhesive, both metal surfaces to be bonded were treated with a gamma-aminopropyltriethoxysilane coupling agent sold under the designation of A-1100 by Union Carbide. The aminosilane coupling agent was applied by dipping the surfaces to be treated in a 2% solution of the aminosilane in isopropyl alcohol. Thereafter, the rivets were withdrawn from the treating solution and rinsed by dipping in de-ionized water. After withdrawing from the de-ionized water, the so-treated surfaces were dried by blow drying and then placed in an oven at 70° C. for one hour to complete the drying operation and foster bonding of the organosilane to the metal surface. After bonding the rivets together and curing in the manner described above, the adhesively bonded rivets were then tested in the same manner as described above. The results obtained are illustrated in FIG. 3.

As shown in this figure, the resistance of the metal/adhesive/metal bond in this example was significantly better than that obtained in Examples 1 and 2 on a consistent basis. This shows the significant improvement in electrical properties produced when the metal surfaces to be bonded are treated by applying an adhesion promoter thereto in accordance with the present invention.

EXAMPLE 4

Figure 4:
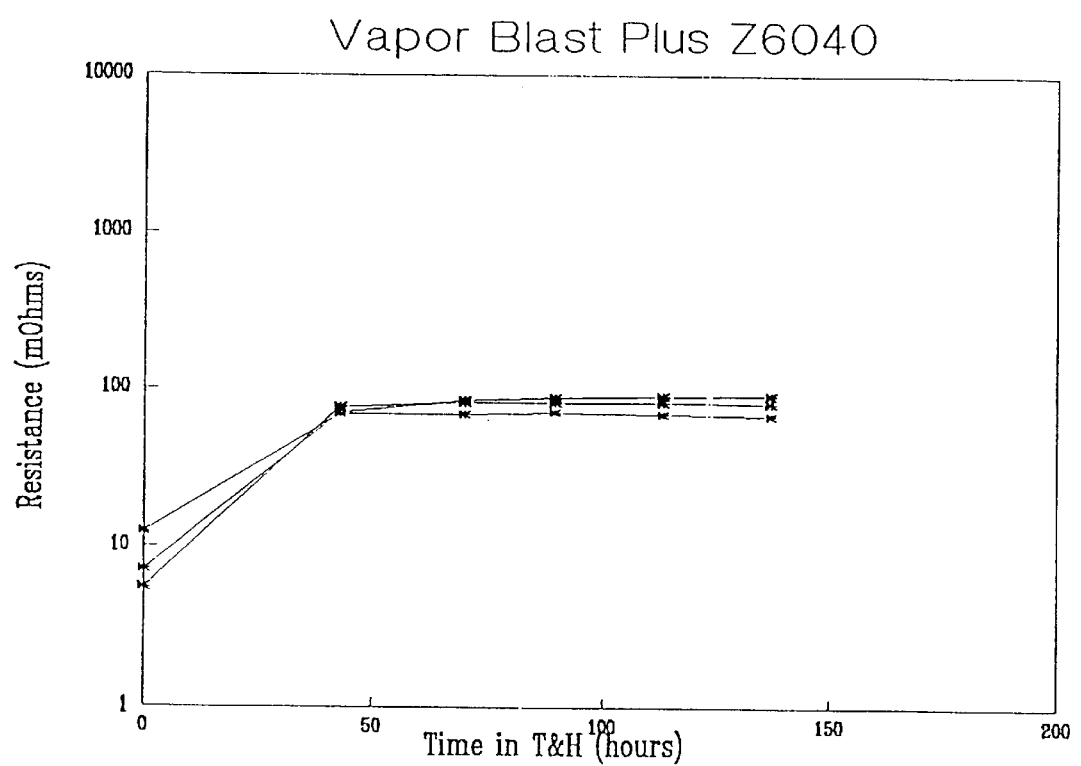

Example 3 was repeated except that the adhesion promoter used was trimethoxy-3-glycidoxysilane (Z6040 available from Dow Corning). The results obtained are set forth in FIG. 4.

As shown in this figure, the electrical properties of the bond so obtained are even better than those obtained in Example 3. This again shows the superior electrical properties obtained in the bonds formed between a metal and an electrically-conductive adhesive when produced in accordance with the present invention.

Although only a few embodiments of the present invention have been described above, it should be appreciated that many modifications can be made without departing from the spirit and scope of the invention. For example, although aluminum has been described above as the metal to be bonded, it should be appreciated that the present invention can be used for bonding any type of electrically-conductive metal. Examples are copper, tin and titanium. All such modifications are intended to be included within the scope of the present invention, which is to be limited only by the following claims:

We claim:

1. A device comprising a metal substrate with a roughened surface, an electrically-conductive adhesive and an intervening layer selected from the group of organosilanes, organotitanates, and organozirconates situated between said roughened surface of said metal substrate and said adhesive, said intervening layer being 100 Angstroms or less in thickness, said intervening layer was applied directly to said roughened surface of said metal substrate prior to application of said adhesive to said intervening layer, said intervening layer substantially coating said roughened surface of said metal substrate to inhibit corrosion, said intervening layer being bonded to said roughened metal surface of said metal substrate and being reacted with said electrically-conductive adhesive, said electrically-conductive adhesive comprising an adhesive material and metal particles or metal coated particles dispersed in said adhesive material.

2. A device as set forth in claim 1 wherein said metal particles or metal coated particles are a majority weight percentage of said electrically-conductive adhesive.

3. A device as set forth in claim 1 wherein said metal particles are about 80 percent of a weight of said electrically-conductive adhesive.

4. A device as set forth in claim 1 wherein said adhesive material comprises a polymer, and said intervening layer is reacted with said polymer.

5. A device as set forth in claim 1 wherein said metal particles or the coating of said metal coated particles comprise silver or gold, whereby said metal particles or said metal coating do not react with said intervening layer.

6. A device as set forth in claim 1 wherein said metal particles or the coating of said metal particles comprise tin or palladium, whereby said metal particles or said metal coating do not react with said intervening layer.

7. A device as set forth in claim 1 wherein said intervening layer is an amine-terminated silane or an epoxy-terminated silane.

8. A device as set forth in claim 1 wherein said metal substrate comprises aluminum and said intervening layer is such as to inhibit corrosion of said aluminum.

9. A method for inhibiting corrosion of a metal substrate and conductively bonding said metal substrate to another metallic object using an adhesive, said method comprising:

roughening a surface of said metal substrate;

forming a discrete coating of organosilanes, organotitanates or organozirconates directly on said roughened surface of said metal substrate to inhibit corrosion of said metal substrate, said coating being 100 Angstroms or less in thickness; and after said forming step, applying an electrically-conductive adhesive on said coating, said coating being chemically bonded to said metal substrate and being reacted with said electrically-conductive adhesive, said electrically-conductive adhesive comprising an adhesive material and metal particles or metal coated particles dispersed in said adhesive material.

10. A method as set forth in claim 9 wherein said adhesive material comprises a polymer, and said intervening layer is reacted with said polymer.

11. A method as set forth in claim 9 wherein said forming step comprises the step of applying a solution of organosilanes, organotitanates or organozirconates onto said metal substrate and, before the adhesion applying step, heating said solution which was applied to said metal substrate to accelerate a hydrolysis reaction between said organosilanes, organotitanates or organozirconates and said metal substrate.

12. A method as set forth in claim 9 wherein said metal particles or the metal coating of said metal coated particles comprise silver or gold where by said metal particles or metal coating do not react with said intervening layer.

13. A method as set forth in claim 9 wherein said metal particles or the metal coating of said metal coated particles comprise tin or palladium, whereby said metal particles or coating do not react with said intervening layer.

14. A method as set forth in claim 9 wherein said roughening step comprises the step of vapor blasting said surface of said metal substrate.

* * * * *